(12) United States Patent
Reder et al.

(10) Patent No.: US 6,355,577 B1
(45) Date of Patent: Mar. 12, 2002

(54) SYSTEM TO REDUCE PARTICULATE CONTAMINATION

(75) Inventors: Steven E. Reder, Boring; Ynhi T. Le, Gresham, both of OR (US)

(73) Assignee: LSI Logice Corporation, Milpitas, CA (US)

( * ) Notice: Subject to any disclaimer, the term of this patent is extended or adjusted under 35 U.S.C. 154(b) by 0 days.

(21) Appl. No.: 09/580,106

(22) Filed: May 30, 2000

(51) Int. Cl.$^7$ ............................................... H01L 21/31
(52) U.S. Cl. ....................... 438/758; 438/791; 414/172; 414/225; 118/500
(58) Field of Search ................................ 438/791, 758; 414/172, 225, 331, 416; 118/500; 423/344; 432/11, 125, 123, 253, 258

(56) References Cited

U.S. PATENT DOCUMENTS

| | | | | |
|---|---|---|---|---|
| 4,355,974 A | | 10/1982 | Lee | 432/253 |
| 4,515,104 A | | 5/1985 | Lee | 118/500 |
| 4,518,349 A | * | 5/1985 | Tressler et al. | 432/11 |
| 4,653,636 A | | 3/1987 | Armstrong | 206/334 |
| 4,770,590 A | * | 9/1988 | Hugnes et al. | 414/172 |
| 4,853,204 A | * | 8/1989 | Azuma et al. | 423/344 |
| 4,981,222 A | | 1/1991 | Lee | 211/41 |
| 4,993,559 A | * | 2/1991 | Cota | 211/41 |
| 5,322,539 A | | 6/1994 | Mathisen et al. | 65/42 |
| 5,665,135 A | | 9/1997 | Izumitani | 65/66 |
| 5,711,781 A | | 1/1998 | Lysson et al. | 65/385 |

FOREIGN PATENT DOCUMENTS

JP       P2000-127020 A   *  5/2000   ........... B24B/29/00

\* cited by examiner

Primary Examiner—Keith Christianson
Assistant Examiner—Timothy Sutton
(74) Attorney, Agent, or Firm—Luedeka, Neely & Graham, P.C.

(57) ABSTRACT

The invention provides a method for depositing a film on a surface of a semiconductor wafer while preventing formation of defects on the surface of the wafer. The method includes selecting a quartz wafer carrier for holding the semiconductor wafer during the depositing of the film, where the wafer carrier has quartz rods with fire-polished slots for receiving an edge of the semiconductor wafer. The semiconductor wafer is placed into the quartz wafer carrier with the edge of the wafer disposed within the fire-polished slots, and the wafer carrier and wafer are loaded into a deposition chamber. Air is evacuated from the deposition chamber, the temperature in the chamber is raised to a deposition temperature, the pressure within the deposition chamber is adjusted to a deposition pressure, and process gases are introduced to the deposition chamber. By reaction of the process gases, the film is deposited on the surface of the wafer and on the wafer carrier. Using a wafer carrier having fire-polished slots provides increased adhesion of the deposited film to the wafer carrier. The increased adhesion prevents spalling of the film off of the wafer carrier which causes particles of the film to impact the wafer. Such particle impacts introduce defects to the wafer which would render the wafer unusable. Thus, using a fire-polished wafer carrier introduces significantly fewer defects to a wafer than does using a non-fire-polished wafer carrier. Therefore, the present invention reduces the number of rejected wafers, thereby saving production time and money.

10 Claims, 5 Drawing Sheets

Section III-III'

SYSTEM TO REDUCE PARTICULATE CONTAMINATION

FIELD

This invention relates to the field of semiconductor wafer processing. More particularly the invention relates to a system for reducing particulate contamination of wafers during low-pressure chemical vapor deposition processing.

BACKGROUND

During fabrication, a semiconductor wafer typically undergoes several types of processing steps that involve thermal processing, such as oxidation, diffusion, annealing, and deposition, such as low pressure chemical vapor deposition. The semiconductor industry utilizes wafer carriers, also referred to as wafer boats, for holding the wafers during such process steps that involve thermal processing. Typically, a wafer boat supports a wafer by contacting the wafer at spaced-apart locations around the wafer's edge, thereby maximizing the amount of surface area on the wafer that is exposed during processing and minimizing the surface area contact between the wafer boat and the wafer. Generally, wafer boats are designed to carry several wafers in a spaced-apart parallel arrangement.

Since the wafer boat carries the wafer during deposition process steps, materials that are deposited onto the wafer during the process steps are generally also deposited onto the wafer boat. Some of these deposited materials have thermal expansion coefficients that are significantly different from the thermal expansion coefficient of the wafer boat. During many of the processing steps, the wafers and the wafer boat are exposed to relatively rapid temperature changes. Due to the differences in the rates of thermal expansion between the wafer boat and the deposited materials, thermal stresses are created in the deposited materials. If the deposited materials do not adhere well to the boat, the thermal stresses can lead to spalling of the deposited material. The spalling causes particles of the deposited material to fly off of the boat, and impact and adhere to the wafers, thereby introducing defects to the wafers.

What is needed, therefore, is a system for thermally processing wafers in a manner that does not contaminate the wafers with particulate matter that is created when deposited materials spall from the wafer carrier.

SUMMARY

The above and other needs are met by a method for depositing a film on a surface of a semiconductor wafer while preventing formation of defects on the surface of the wafer. The method includes selecting a quartz wafer carrier for holding the semiconductor wafer during the depositing of the film, where the wafer carrier has quartz rods with fire-polished slots for receiving an edge of the semiconductor wafer. The slots of the selected wafer carrier extend into the quartz rods to a slot depth, and have surfaces that are fire-polished to a polished depth within the slots. The method also includes placing the semiconductor wafer into the quartz wafer carrier with the edge of the wafer disposed within the fire-polished slots, and loading the wafer carrier and the wafer into a deposition chamber. The method further includes evacuating air from the deposition chamber, heating the wafer carrier and the wafer to a deposition temperature, adjusting pressure within the deposition chamber to a deposition pressure, and introducing process gases to the deposition chamber. By reaction of the process gases, the film is deposited on the surface of the wafer and on the wafer carrier.

Using a wafer carrier with fire-polished slots provides increased adhesion of the deposited film to the wafer carrier. The increased adhesion prevents spalling of the film off of the wafer carrier which causes particles of the film to impact the wafer held in the carrier. Such particle impacts introduce defects to the wafer which would render either the wafer or the devices on the wafer unusable.

Thus, using a fire-polished wafer carrier according to the present invention introduces significantly fewer defects to a wafer than does using a non-fire-polished wafer carrier. Therefore, use of the present invention reduces both the number of rejected wafers and the number of rejected devices, thereby saving production time and money.

A preferred embodiment of the invention includes selecting a wafer carrier having fire-polished slots with a polished depth of at least 6 percent of the slot depth, where the slot surfaces have a surface roughness of no greater than about 50 micro inches within the polished depth.

An alternate embodiment of the invention includes selecting a wafer carrier having fire-polished slots with a polished depth of at least about 30 percent of the slot depth and a highly-polished depth of at least about 13 percent of the slot depth, where the slot surfaces have a surface roughness of no greater than about 35 micro inches within the polished depth, and no greater than about 15 micro inches within the highly-polished depth.

In some preferred embodiments of the invention, the depositing step includes depositing a silicon nitride film on the semiconductor wafer.

In other preferred embodiments, the method includes coating the wafer carrier with a silicon nitride film prior to placing the semiconductor wafer into the quartz wafer carrier.

Some preferred embodiments include heating the wafer carrier and the wafer to a deposition temperature of between about 710 degrees C. and about 805 degrees C., and adjusting the pressure within the deposition chamber to a deposition pressure of between about 0.1 Torr and about 0.2 Torr.

In another aspect, the invention provides a wafer produced according to the method described above.

In a further aspect, the invention provides a semiconductor device produced according to the method described above.

In yet another aspect, the invention provides a wafer carrier for holding a semiconductor wafer during deposition of a film on a surface of the wafer in a low-pressure chemical vapor deposition process. The wafer carrier of the present invention provides for increased adhesion of film material that is deposited on the wafer carrier during the deposition process, thereby preventing spalling of the film material which can cause particles of the film material to impact the wafer and introduce defects to the wafer. The wafer carrier includes multiple quartz rods, each having multiple spaced-apart substantially parallel slots that extend into the rod to a slot depth. The slots are substantially perpendicular to a center axis of the rod, and have fire-polished slot surfaces. The carrier includes a structure for rigidly supporting the quartz rods with their center axes disposed substantially in parallel, thereby defining a cylindrical frame.

In preferred embodiments of the invention, the fire-polished slots of the carrier have a polished depth of at least about 6 percent of the slot depth, and the slot surfaces have a surface roughness of no greater than about 50 micro inches within the polished depth.

In other embodiments, the fire-polished slots have a polished depth of at least about 30 percent of the slot depth and a highly-polished depth of at least about 13 percent of the slot depth. Within the polished depth, the slot surfaces have a surface roughness of no greater than about 35 micro inches, and within the highly-polished depth, the slot surfaces have a surface roughness of no greater than about 15 micro inches.

In another aspect, the invention provides a wafer produced using the wafer carrier described above.

In a further aspect, the invention provides a semiconductor device produced using the wafer carrier described above.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
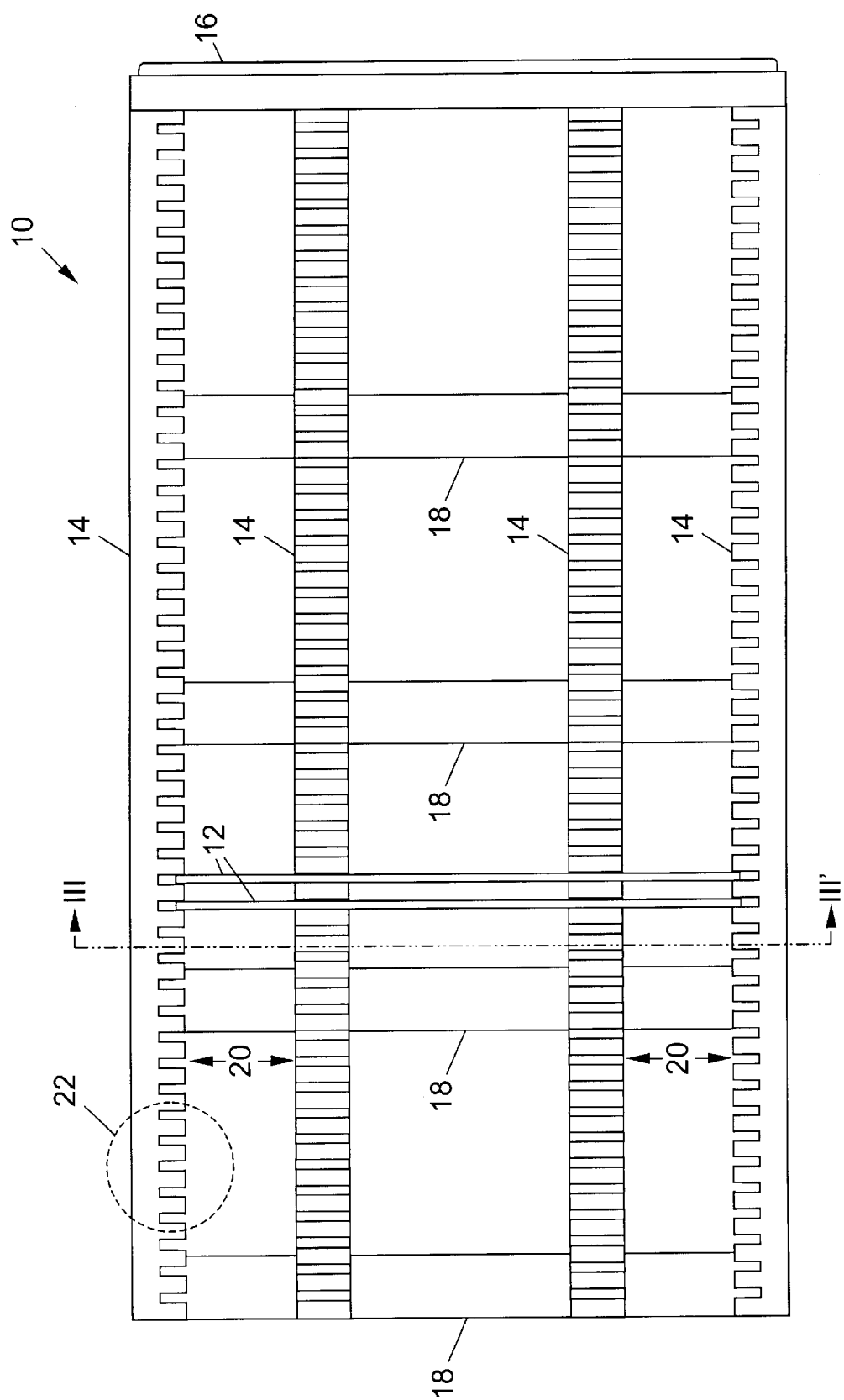
FIG. 1 depicts a fire-polished quartz boat according to a preferred embodiment of the invention.

Depicted in FIG. 1 is a quartz carrier 10, also referred to as a quartz boat, for holding semiconductor wafers 12 as the wafers undergo low-pressure chemical vapor deposition processing. The carrier 10 has several parallel quartz rods 14 that are preferably supported at one end by a quartz disk 16 and at the other end by a quartz ring 18. The preferred embodiment of the invention includes six of the rods 14, although the invention is not limited to any particular number of rods 14. Preferably, several quartz rings 18 are distributed along the length of the carrier 10 to further support the rods 14 and provide rigidity to the carrier 10. The rods 14 are spaced radially about the disk 16 and rings 18 to form a substantially cylindrical frame.

Each rod 14 has a set of slots 20 distributed along the length of the rod 14. Corresponding slots 20 in each rod 14 receive the edge of the wafer 12 when the wafer 12 is placed in the carrier 10, thereby maximizing the amount of surface area on the wafer 12 that is exposed during processing and minimizing the surface area contact between the carrier 10 and the wafer 12. Preferably, each rod 14 has about 176 slots, such that the carrier 10 can hold up to about 176 wafers in a distributed parallel arrangement.

Figure 2:
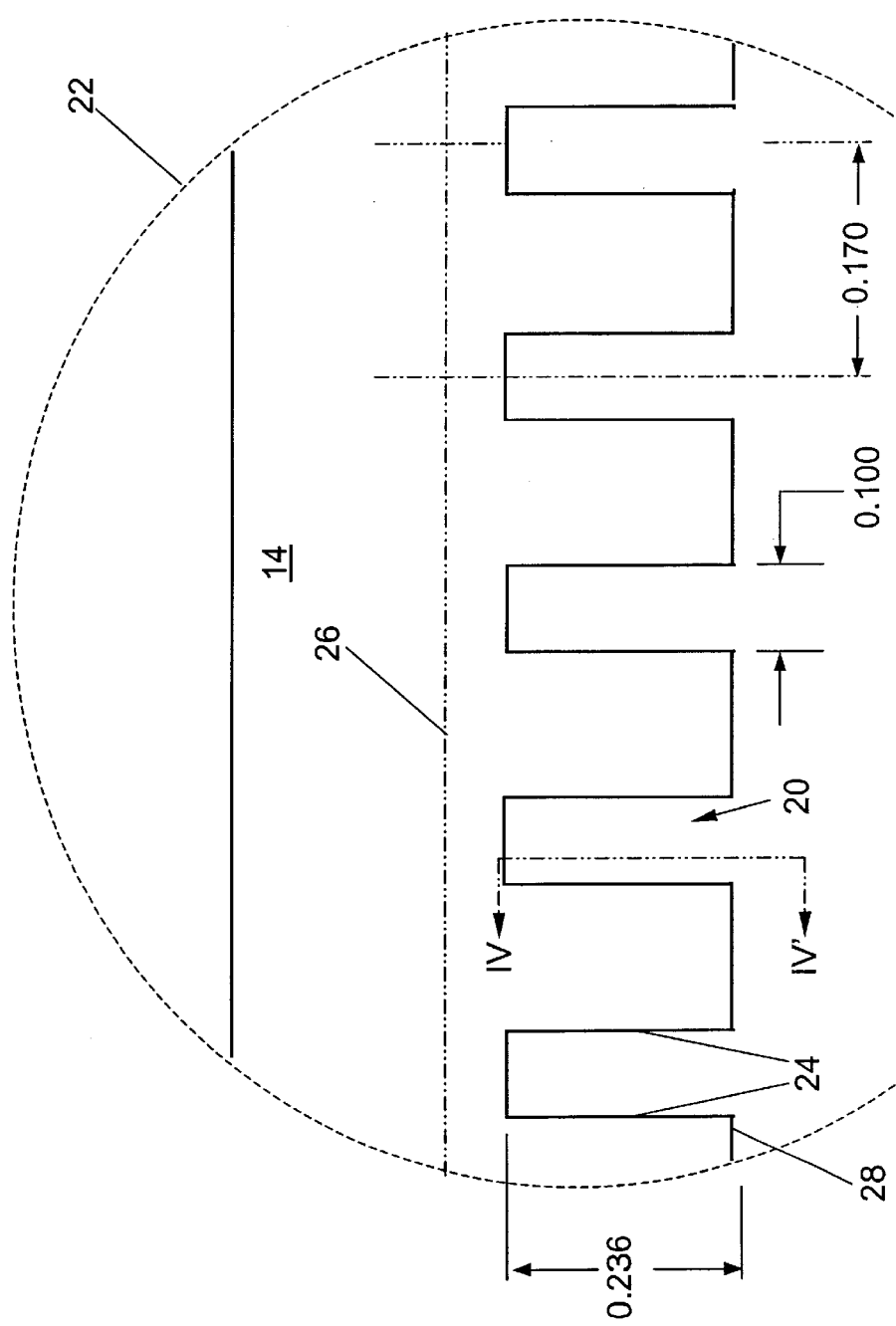
FIG. 2 depicts an enlarged view of a portion of the fire-polished quartz boat of FIG. 1.

FIG. 2 depicts an enlarged view of one of the rods 14 in the outlined region 22 of FIG. 1. Preferably, each slot 20 is about 0.100 inch wide and has a depth of 0.236 inch. In the preferred embodiment, the slots 20 are distributed on 0.170 inch centers along the rod 14. It should be appreciated that these slot dimensions are preferred, but are not critical to the functioning of the invention. Preferably, the slots 20 have parallel surfaces 24 that are perpendicular to the centerline 26 of the rod 20.

In the preferred embodiment of the invention, the slots 20 are formed in the rods 14 by cutting with a diamond saw. This cutting process results in a roughness on the slot surfaces 24 of about 85 micro inches, and leaves jagged corners 28. It has been determined that, if rods 14 having this level of roughness and jaggedness are exposed to a low-pressure chemical vapor deposition process to apply silicon nitride, the silicon nitride deposited on the rods 14 tends to spall. As discussed in more detail below, such spalling causes particles of the silicon nitride to be ejected from the rods 14 and to impact the wafers 12, thereby causing defects to the wafers 12.

Figure 3:
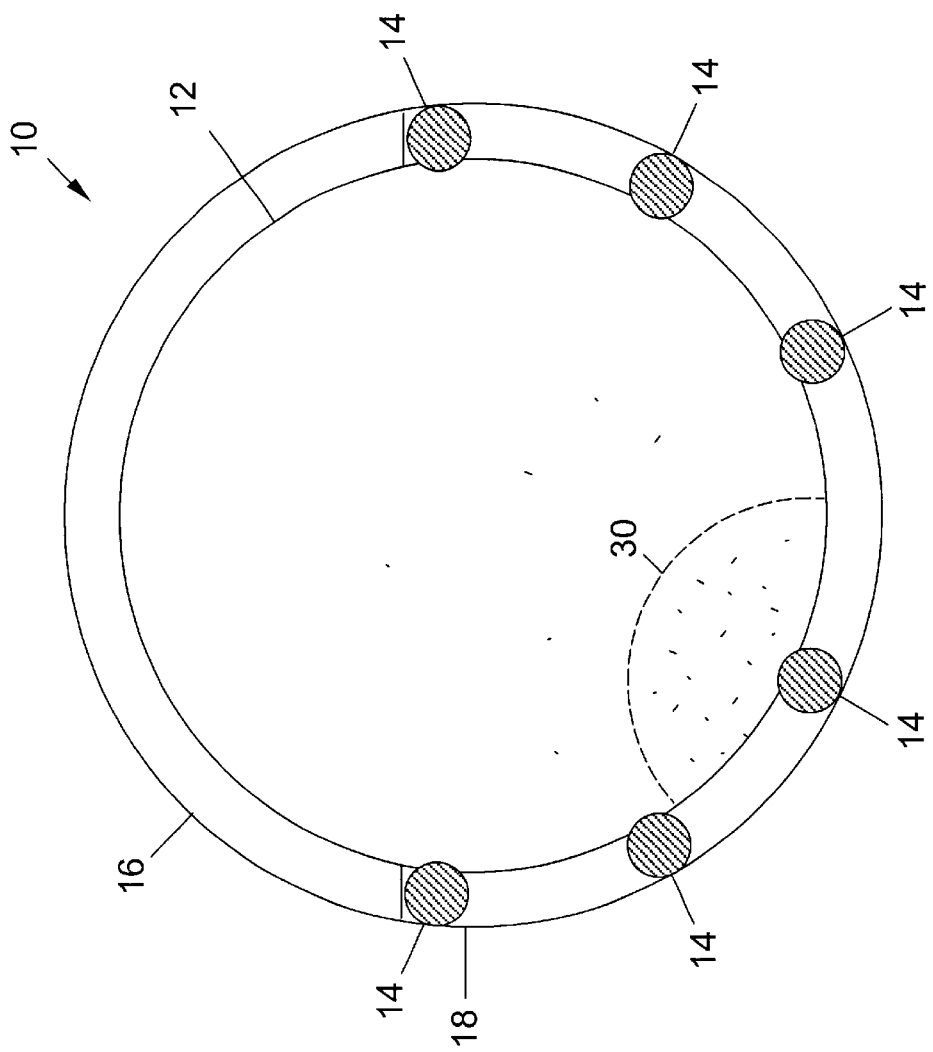
FIG. 3 depicts a cross-sectional view of the fire-polished quartz boat of FIG. 1.

FIG. 3 depicts a cross-sectional view of the carrier 10 taken at section line III–III' of FIG. 1. FIG. 3 also depicts the wafer 12 which has been seated in the carrier by sliding the edges of the wafer through the slots 20. It will be appreciated that the uppermost rods 14 are positioned so as to allow the full diameter of the wafer 12 to pass therebetween when the wafer is inserted into the carrier 10. As shown in FIG. 3, once seated in the carrier 10, the wafer 12 is preferably supported at six locations about its perimeter by the six rods 14. Adjacent the rods 14 are regions of the wafer 12 (indicated by the dashed lines 30) that may be subjected to large numbers of particle impacts during the low pressure chemical vapor deposition silicon nitride deposition process if the silicon nitride on the rods 14 spalls. Particle impacts may also occur in other regions of the wafer 12, although the density of the impacts tends to be inversely proportional to the distance away from the rods 14. The average size of these silicon nitride particles is about 0.13 microns and larger, which is large enough to cause a significant defect in the silicon wafer 12.

It has been determined that spalling of a silicon nitride coating on the surface of the carrier 10 is significantly reduced by fire-polishing the surfaces 24 and the corners 28 of the slots 20. While not embracing any particular theory of operation, the spalling is apparently caused by differences in the rates of thermal expansion of the quartz rods 14 and the deposited silicon nitride, and by poor adhesion of the silicon nitride to the rough surfaces 24 and the jagged edges 28 of the slots 20. The coefficients of thermal expansion of quartz and silicon nitride are approximately $0.5\times10^{-6}$/degrees C. and $5.5\times10^{-6}$/degrees C., respectively. Thus, the silicon nitride expands upon heating and contracts upon cooling at a rate which is about an order of magnitude greater than that of the quartz.

If the adhesion of the silicon nitride to the quartz is poor, the stresses caused by the differences in thermal expansion rates can cause the silicon nitride to crack and flake away from the surface of the rod 14. This problem is particularly severe at the sharp corners 28 of the slots 20. In one theory of operation, fire-polishing the slots 20 increases the adhesion of the silicon nitride to the slot surfaces 24 and corners 28, thereby preventing the silicon nitride from breaking away under stress. In another theory of operation, fire-polishing reduces stress in the silicon nitride by eliminating sharp edges and small fractures at the surfaces 24 and in the corners 28 of the slots. Without these points of concentrated stress in the quartz, the silicon nitride is less likely to fracture and break during the stress of thermal expansion.

Figure 4B:
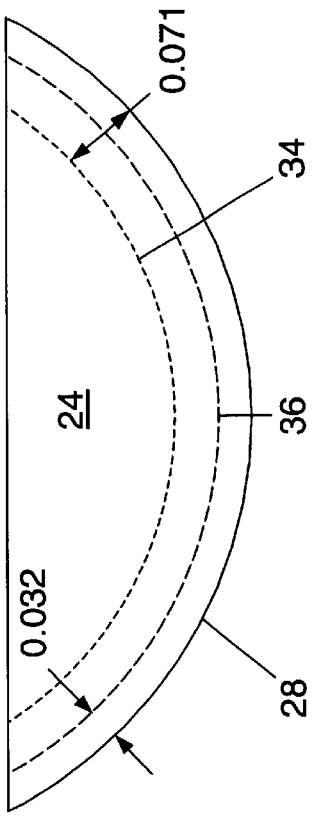
FIG. 4 depicts a surface of a fire-polished slot of the quartz boat of FIG. 1.
Figure 4A:
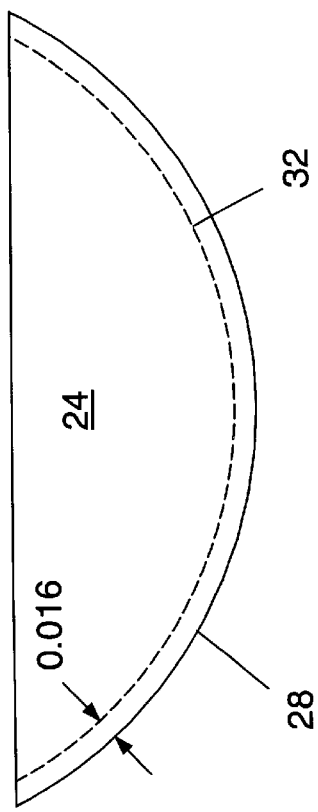

In a preferred embodiment of the invention, after cutting the slots 20 with a diamond saw, the slots 20 are exposed to a fire polishing process. FIGS. 4A and 4B depict a view of the surface 24 of a slot 20 according to view IV–IV' of FIG. 2. FIG. 4A depicts a slot 20 which has been exposed to light fire polishing, where the polishing penetrates into the slot 20 to a polished depth of about 0.016 inch, as represented by the dashed line 32. Thus, the polished depth is about 6 percent of the total depth of the slot, which is about 0.236 inch. The surface roughness of the surface 24 of the slot within this polished depth is no greater than about 50 micro inches. By comparison, the surface roughness of the unpolished portion of the slot 20 is about 85 micro inches.

In an alternate embodiment of the invention, the slots 20 are exposed to a "heavy" fire polishing process. As shown in FIG. 4B, which depicts a slot 20 exposed to heavy fire polishing, the polishing penetrates into the slot 20 to a polished depth of about 0.071 inch as represented by the dashed line 34, or to about 30 percent of the total depth of the slot. The surface roughness of the surface 24 of the slot within this polished depth is no greater than about 35 micro inches. Heavy fire polishing also produces a highly-polished region of the slot that penetrates to a depth of about 0.032 inch as represented by the dashed line 36, or to about 13.4 percent of the total depth of the slot. The surface roughness within this highly-polished depth is no greater than about 15 micro inches.

A significant decrease in wafer defects due to silicon nitride particle impacts has been noted with both heavy and light fire-polishing. However, light fire-polishing is preferred, as heavy fire-polishing tends to distort the shape of the slot 20, thus making it more difficult to place the edges of the semiconductor wafers 12 within the slots 20.

In many applications, adhesion is improved by making the interface surface more rough. Thus, smoothing the surfaces and edges of the slots of a wafer boat to promote adhesion of silicon nitride to the boat is counterintuitive. However, the inventors have determined that smoothing the slot surfaces by fire polishing is effective in promoting good adhesion of the silicon nitride to the surfaces of the boat.

Figure 5:
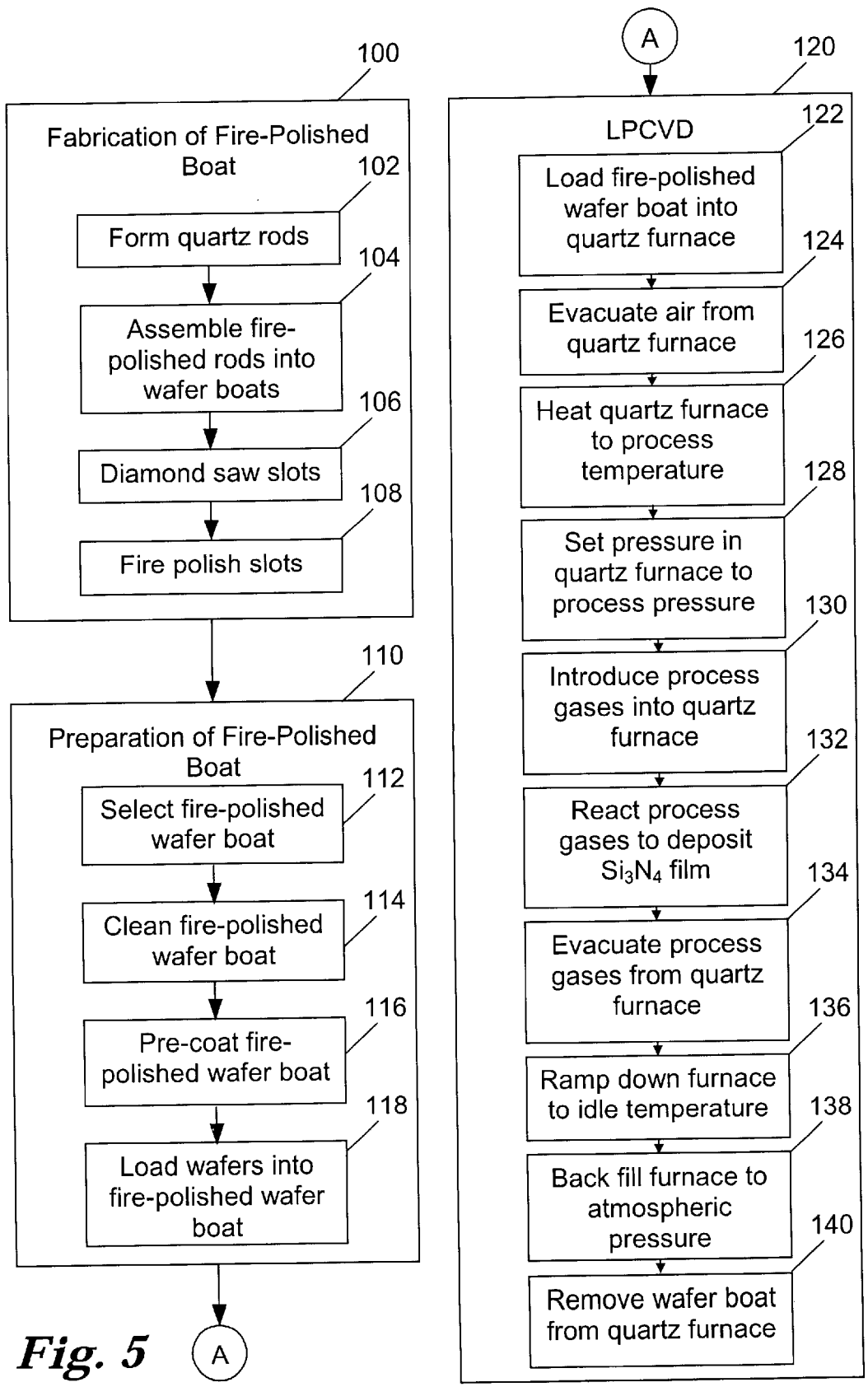
FIG. 5 is a flow diagram of a preferred method for applying silicon nitride to a semiconductor wafer using a fire-polished quartz boat according to a preferred embodiment of the invention.

With reference to FIG. 5, a method for reducing silicon nitride particle impacts and resulting wafer defects will now be explained in greater detail. In a boat preparation portion 100 of the method, first the quartz rods 14 are formed, such as by an extrusion process (step 102). Next, the rods 14 are attached to the disk 16 and the rings 18 to form the carrier 10. (step 104). The slots 20 are cut into the rods 14 by diamond sawing to the preferred dimensions shown in FIG. 2 (step 106). The slots 20 are then fire-polished to achieve either a light or heavy fire polish as described above (step 108). Preferably, the fire-polishing is done by passing the rods 14 through a pure flame produced by burning $H_2$ and $O_2$ in a $H_2$:$O_2$ ratio not exceeding 2:1.

In a boat preparation portion 110 of the method, the fire-polished boat 10 is selected from stock (step 112), and is rinsed for about three minutes using a 10:1 mixture of de-ionized $H_2O$:49% hydrofluoric acid, followed by an extensive de-ionized $H_2O$ rinse to remove all residual acid (step 114). The boat 10 is then allowed to air dry in a clean-room environment at room temperature.

Preferably, prior to use in coating a wafer 12, the fire-polished boat 10 is pre-coated with a film of silicon nitride to a thickness about twice that deposited on the wafers 12, using the same process conditions, such as temperature and pressure, as those used to deposit the silicon nitride on the wafers 12 (step 116). This pre-coat provides an encapsulant for any foreign materials that may still be on and out-gas from the boat 10 during subsequent processing.

After cleaning and pre-coating the fire-polished boat 10, semiconductor wafers 12 that have been prepared for silicon nitride coating are loaded into the boat 10 (step 118). The wafers 12 are loaded by sliding the wafers 12 into the boat 10 with their edges positioned within the fire-polished slots 20.

In a low pressure chemical vapor deposition portion 120 of the method, the fire-polished boat 10 is loaded into a deposition chamber, such as a furnace (step 122). The air within the chamber is evacuated (step 124), and the temperature within the chamber is raised to a process temperature (step 126). In the preferred embodiment, the process temperature is approximately 765 degrees C. The pressure within the chamber is set to the process pressure, which is preferably between about 0.1 Torr and about 0.2 Torr (step 128). Process gases are then introduced into the deposition chamber (step 130). The process gases react with each other, resulting in deposition of silicon nitride on the surface of the wafer 12 and on surfaces of the boat 10 (step 132). When the film on the wafer 12 has reached a desired thickness, such as about 1500 angstroms, the flow of process gases is discontinued, the process gases are evacuated (step 134) and the temperature is ramped down to about 600 degrees C. (step 136). The furnace is backfilled with a gas, such as nitrogen, to atmospheric pressure (step 138), and the boat 10 and wafers 12 are then removed from the deposition chamber (step 140).

Typically, a single boat 10 may be re-used in processing multiple batches of wafers 12. For example, a single boat 10 may repeat steps 120–136 of FIG. 5 twenty-five to thirty times, during which as much as about 38,000 angstroms to about 42,000 angstroms of silicon nitride may be deposited on the surfaces of the boat 10. In the preferred embodiment, the boat 10 is reused until it accumulates approximately 35,000 angstroms of silicon nitride film. If the slots 20 of the rods 14 are not fire-polished, then the silicon nitride is prone to spalling at thicknesses of about 3,000 angstroms and greater. With fire-polishing, spalling is significantly reduced at silicon nitride thicknesses of up to about 40,000 angstroms. Thus, a fire-polished boat 10 may be used for many more low pressure chemical vapor deposition cycles than a boat that has not been fire polished. Since each fire-polished boat 10 may be used in more deposition cycles, fewer of the boats 10 are "consumed" by the deposition process. Therefore, fire-polishing the boats 10 tends to decrease the per unit cost of each semiconductor wafer 12.

Since the fire-polished boats 10 are less prone to spalling during the silicon nitride deposition process of FIG. 5, a wafer 12 produced by the process of FIG. 5 has fewer defects than a wafer produced using a non-fire-polished boat. Thus, the process of FIG. 5 results in fewer rejected wafers, thereby saving production time and money.

It is appreciated that the invention as described above comprehends numerous adaptations, rearrangements, and substitutions of parts, all of which are considered to be within the scope and spirit of the invention as described. For example, the described method for using a quartz boat 10 having fire-polished slots 20 is equally applicable to low pressure chemical vapor deposition processes for depositing other thicknesses of silicon nitride. Further, the method may be used in other low pressure chemical vapor deposition applications, such as poly silicon, amorphous silicon, or TEOS in any thickness of film. Thus, the scope of the invention is only to be restricted by the language of the claims given below.

What is claimed is:

1. A method for depositing a film on a surface of a semiconductor wafer while preventing formation of defects on the surface of the wafer, the method comprising:

(a) selecting a quartz wafer carrier for holding the semiconductor wafer during the depositing of the film, the wafer carrier having quartz rods with fire-polished slots for receiving an edge of the semiconductor wafer, the slots extending into the quartz rods to a slot depth, the slots having surfaces that are fire-polished to a polished depth within the slots;

(b) placing the semiconductor wafer into the quartz wafer carrier with the edge of the wafer disposed within the fire-polished slots;

(c) loading the wafer carrier and the wafer into a deposition chamber;

(d) evacuating air from the deposition chamber;

(e) heating the wafer carrier and the wafer to a deposition temperature;

(f) adjusting pressure within the deposition chamber to a deposition pressure;

(g) introducing process gases to the deposition chamber; and (h) depositing the film on the surface of the wafer and on the wafer carrier by reaction of the process gases, where the fire-polished slots provide increased adhesion of the film to the wafer carrier, thereby preventing spalling of the film on the wafer carrier which cause particles of the film to impact the wafer and introduce defects.

2. The method of claim 1 wherein step (a) further comprises selecting a wafer carrier having fire-polished slots with a polished depth of at least 6 percent of the slot depth, the slot surfaces having a surface roughness of no greater than about 50 micro inches within the polished depth.

3. The method of claim 1 wherein step (a) further comprises selecting a wafer carrier having fire-polished slots with a polished depth of at least about 30 percent of the slot depth, the slot surfaces having a surface roughness of no greater than about 35 micro inches within the polished depth.

4. The method of claim 3 wherein step (a) further comprises selecting a wafer carrier having fire-polished slots with a highly-polished depth of at least about 13 percent of the slot depth, the slot surfaces having a surface roughness of no greater than about 15 micro inches within the highly-polished depth.

5. The method of claim 1 wherein step (h) further comprises depositing a silicon nitride film on the semiconductor wafer.

6. The method of claim 5 further comprising coating the wafer carrier with a silicon nitride film prior to step (b).

7. The method of claim 1 wherein step (e) further comprises heating the wafer carrier and the wafer to a deposition temperature of between about 710 degrees C. and about 805 degrees C.

8. The method of claim 1 wherein step (f) further comprises adjusting the pressure within the deposition chamber to a deposition pressure of between about 0.1 Torr and about 0.2 Torr.

9. A method for depositing a silicon nitride film on a surface of a semiconductor wafer while preventing formation of defects on the surface of the wafer, the method comprising:

(a) selecting a quartz wafer carrier for holding the semiconductor wafer during the process of depositing the film, the wafer carrier having quartz rods with fire-polished slots for receiving an edge of the semiconductor wafer, the slots extending into the quartz rods to a slot depth, the slots having surfaces that are fire-polished to a polished depth which is at least about 6 percent of the slot depth, the slot surfaces having a surface roughness of no greater than about 50 micro inches within the polished depth;

(b) placing the semiconductor wafer into the quartz wafer carrier with the edge of the wafer disposed within the fire-polished slots;

(c) loading the wafer carrier and the wafer into a deposition chamber;

(d) evacuating air from the deposition chamber;

(e) heating the wafer carrier and the wafer to a deposition temperature of between about 710 degrees C. and about 805 degrees C.;

(f) adjusting pressure within the deposition chamber to a deposition pressure of between about 0.1 Torr and about 0.2 Torr;

(g) introducing process gases to the deposition chamber; and (h) depositing the silicon nitride film on the surface of the wafer and on the wafer carrier by reaction of the process gases, where the fire-polished slots provide increased adhesion of the silicon nitride film to the wafer carrier, thereby preventing spalling of the silicon nitride film on the wafer carrier which can cause particles of silicon nitride to impact the wafer and introduce a defect.

10. The method of claim 9 further comprising coating the wafer carrier with a silicon nitride film prior to step (b).

* * * * *